(12) United States Patent
Terakura et al.

(10) Patent No.: US 9,905,431 B2
(45) Date of Patent: Feb. 27, 2018

(54) DRY ETCHING METHOD

(71) Applicant: Hitachi High-Technologies Corporation, Minato-ku, Tokyo (JP)

(72) Inventors: Satoshi Terakura, Tokyo (JP); Masahito Mori, Tokyo (JP); Takao Arase, Tokyo (JP); Ryuta Machida, Tokyo (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 0 days.

(21) Appl. No.: 14/448,709

(22) Filed: Jul. 31, 2014

(65) Prior Publication Data
US 2015/0221518 A1    Aug. 6, 2015

(30) Foreign Application Priority Data
Jan. 31, 2014 (JP) ................. 2014-016335

(51) Int. Cl.
| | |
|---|---|
| *H01L 21/302* | (2006.01) |
| *H01L 21/461* | (2006.01) |
| *C03C 15/00* | (2006.01) |
| *C03C 25/68* | (2006.01) |
| *B44C 1/22* | (2006.01) |
| *H01L 21/311* | (2006.01) |
| *H01L 21/3213* | (2006.01) |
| *H01L 27/11556* | (2017.01) |
| *H01L 27/11582* | (2017.01) |

(52) U.S. Cl.
CPC ...... *H01L 21/31116* (2013.01); *H01L 21/311* (2013.01); *H01L 21/31138* (2013.01); *H01L 21/31144* (2013.01); *H01L 21/32136* (2013.01); *H01L 21/32137* (2013.01); *H01L 21/32139* (2013.01); *H01L 27/11556* (2013.01); *H01L 27/11582* (2013.01)

(58) Field of Classification Search
None
See application file for complete search history.

(56) References Cited

U.S. PATENT DOCUMENTS 5,830,807 A * 11/1998 Matsunaga et al. ........... 438/714
2012/0298911 A1 * 11/2012 Hibino et al. ............... 252/79.1
(Continued)

FOREIGN PATENT DOCUMENTS

| JP | 07-263415 A | 10/1995 |
|---|---|---|
| JP | 2001-358118 A | 12/2001 |

(Continued)

OTHER PUBLICATIONS

Office Action for related Korean Application No. 2014-94956, dated Nov. 19, 2015 (partial English translation provided).

(Continued)

*Primary Examiner* — Stephanie P Duclair
(74) *Attorney, Agent, or Firm* — Miles & Stockbridge P.C.

(57) ABSTRACT

In the present invention, a dry etching method for plasma etching a second laminated film in which a first laminated film in which a silicon-containing film and a silicon dioxide film are laminated is laminated in plurality and an inorganic film arranged over the second laminated film, includes etching the inorganic film and the second laminated film by a mixed gas of an $NF_3$ gas and a $CH_3F$ gas.

10 Claims, 5 Drawing Sheets

(56) References Cited

U.S. PATENT DOCUMENTS

2013/0029492 A1* 1/2013 Inoue et al. .................. 438/719
2015/0303069 A1 10/2015 Narishige et al.

FOREIGN PATENT DOCUMENTS

| JP | 2013-080909 A | 5/2013 |
| JP | 2014-017406 A | 1/2014 |
| KR | 2012-0083469 A | 7/2012 |
| KR | 2012-0107530 A | 10/2012 |
| KR | 2013-0046407 A | 5/2013 |

OTHER PUBLICATIONS

Office Action dated Jun. 13, 2017 for related Japanese Patent Application No. 2014-016335.

* cited by examiner

DRY ETCHING METHOD

BACKGROUND OF THE INVENTION

The present invention relates to a dry etching method in which plasma is used and, in particular, to an etching method for a three-dimensional structure device.

Recently, along with a high integration of a flash memory, a three-dimensional memory structure in which a channel or a gate electrode of each storage device is laminated in the vertical direction is studied. For realizing such a three-dimensional memory structure, an etching technology in which a Poly-Si film and an $SiO_2$ film, or an SiN film and an $SiO_2$ film are set to a pair layer and a via or a trench having a high aspect ratio can be consistently processed to a plurality of pair layers is required.

For example, JP-A-2013-80909 discloses that an amorphous carbon layer (ACL; hereinafter, referred to as an ACL) is set to a mask film, and when a high aspect laminated structure having a pair layer of a Poly-Si film and an $SiO_2$ film is dry etched, a mixed gas containing an $NF_3$ gas and a $CH_2F_2$ gas is used. Further, JP-A-2013-80909 discloses a technology in which in a main etching process, a via is etched to a taper shape by a gas system and an over etching process in which pressure is dropped is continuously applied, and thereby a bottom part having the taper shape is widened and a via having a high aspect ratio is vertically etched.

SUMMARY OF THE INVENTION

Figure 1:
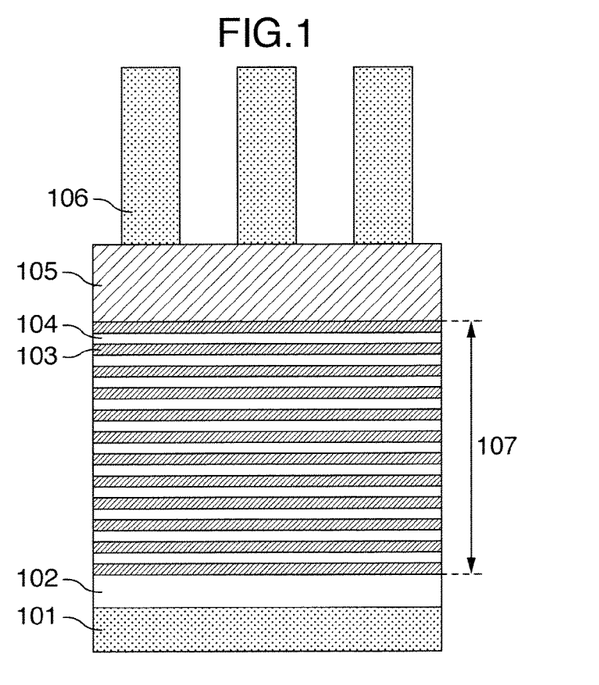
FIG. 1 illustrates a cross section of a three-dimensional memory device part to which the present invention is applied.
Figure 2:
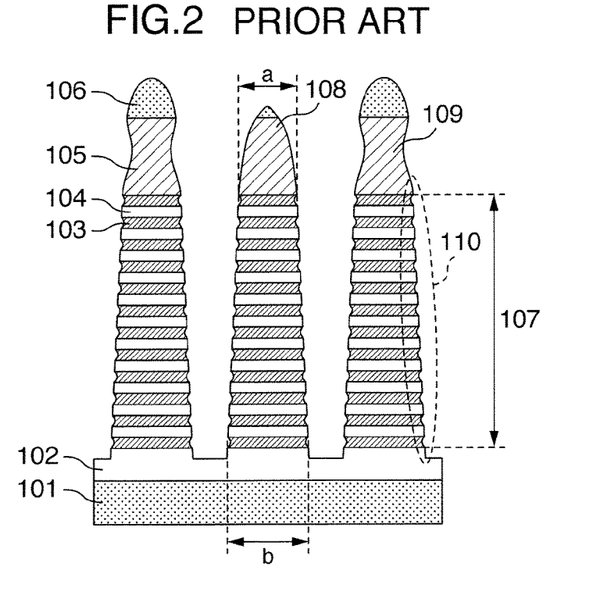
FIG. 2 illustrates an etching shape in the case where a conventional technology is applied.

An etching method disclosed in JP-A-2013-80909 is illustrated in FIG. 1, and further FIG. 2 illustrates a schematic view of a processing cross section in the case where an inorganic film 105 for forming a hard mask and a laminated film 107 in which a pair layer made of a Poly-Si film 104 and an $SiO_2$ film 103 is laminated in plurality are consistently etched in the same processing chamber. Side dropping 108 of the inorganic film 105 occurs and side etching 109 occurs due to the shortage of a residual amount of a mask 106 being an ACL mask.

Further, the laminated film 107 has a taper shape, and a scalloping shape 110 in which as the Poly-Si film 104 is positioned at an upper layer part, larger side etching occurs is generated. At this time, a CD shift amount defined by b-a of FIG. 2 is approximately 27 nm, and the CD shift amount causes a problem that an upper layer part is different from a lower layer part in memory characteristics.

Therefore, in the present invention, provided is a dry etching method for plasma etching an inorganic film for forming a hard mask and a plurality of pair layers, including suppressing side etching to the inorganic film and a scalloping shape.

In the present invention, a dry etching method for plasma etching a second laminated film in which a first laminated film in which a silicon-containing film and a silicon dioxide film are laminated is laminated in plurality and an inorganic film arranged over the second laminated film, includes etching the inorganic film and the second laminated film by a mixed gas of an $NF_3$ gas and a $CH_3F$ gas.

According to the present invention, a dry etching method for plasma etching an inorganic film for forming a hard mask and a plurality of pair layers, includes suppressing side etching to the inorganic film and a scalloping shape.

DESCRIPTION OF THE EMBODIMENTS

Figure 4:
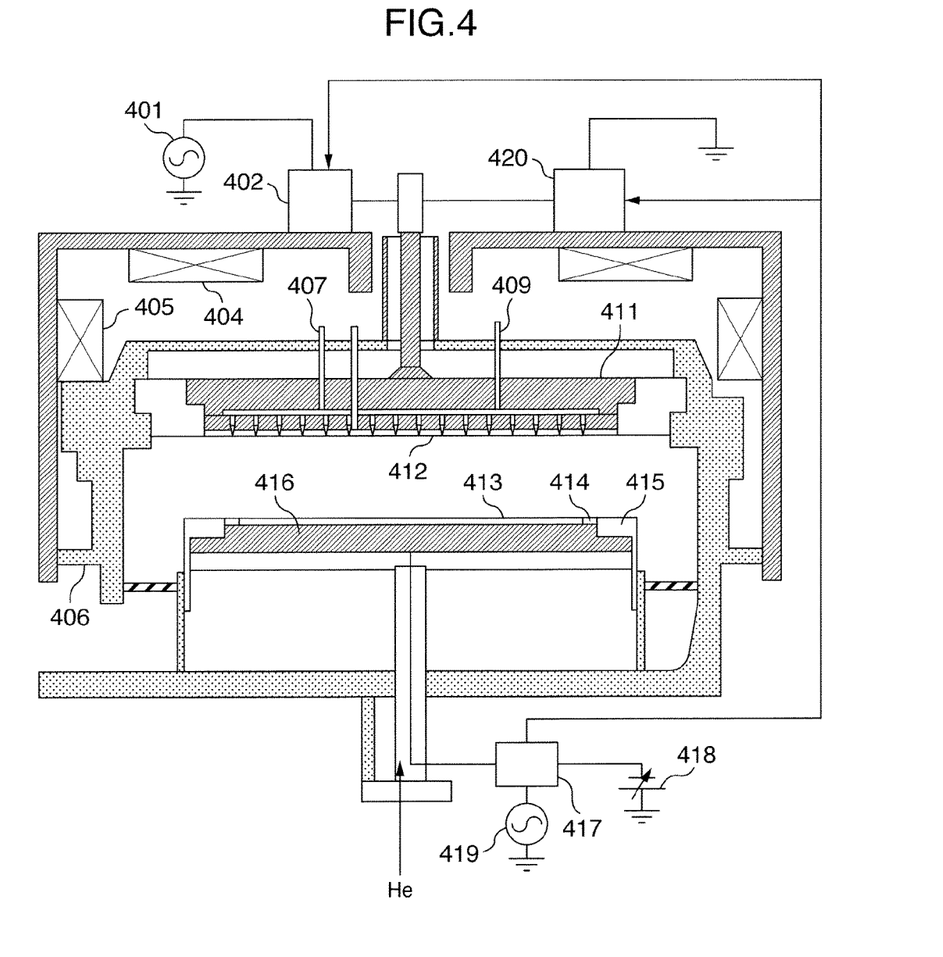
FIG. 4 is a cross sectional view of an effective magnetic field VHF dry etching apparatus.

First, a dry etching apparatus according to the present invention will be described. FIG. 4 is a longitudinal cross-sectional view of a parallel plate type effective magnetic field VHF (Very High Frequency; hereinafter, referred to as VHF) dry etching apparatus. A vacuum vessel of the dry etching apparatus includes an etching chamber 406 as a plasma processing chamber, a VHF radiating antenna 411 that radiates VHF waves, a vacuum pump (not illustrated) that evacuates the vacuum vessel, and a pressure control valve (not illustrated) that controls pressure in the plasma processing chamber.

A gas for etching passes through a mass flow controller (not illustrated) and a stop valve (not illustrated). Thereafter, through a first gas feed port 407 and a second gas feed port 409, the gas for etching is concentrically introduced into a shower plate 412 of the etching chamber 406, respectively. Then, the gas is exhausted from an exhaust hole (not illustrated) provided under the vacuum vessel by a turbo-molecular pump (not illustrated) and a dry pump (not illustrated). The gas introduced as described above is dissociated to thereby generate and keep plasma by energy of electromagnetic waves irradiated by a plasma generating unit.

The plasma generating unit has a power supply for sources 401 for VHF waves of 200 MHz, a matching box for source electromagnetic waves 402, and a magnetic field generating unit having a first electromagnet 404 and a second electromagnet 405. A plasma generation distribution is uniformized by using the two electromagnets. The generated magnetic field is 10 mT or less in the vicinity of the shower plate 412.

A wafer stage 416 on which a wafer 413 being a sample is placed has ring-shaped focus ring 414 and susceptor 415 arranged while covering an outer peripheral side and a sidewall of a placement surface of the wafer 413. Further, by using a plurality of temperature control units (not illustrated), the wafer stage 416 can control a plurality of parts of the wafer stage 416 to different predetermined temperatures Further, through a DC voltage supplied by a DC power supply for ESC 418, the wafer 413 is electrostatically adsorbed to the placement surface of the wafer stage 416 being a sample stage. To the wafer stage 416, a radio frequency bias power supply 419 for 4 MHz and a radio frequency bias matching box 417 for attracting ions to the wafer 413 from among plasma and controlling energy of the ions are further connected.

The radio frequency bias power supply 419 can output power from about 1 W at the minimum electric power up to about 6000 W at the maximum electric power corresponding to a continuous sine wave, to the wafer 413 having a diameter of 12 inch. Further, to obtain effects of reduction in charge-up damage (electronic shading) and vertical processability, the radio frequency bias power supply 419 can supply a time modulated radio frequency power of two levels. In the time modulated radio frequency power, power of two levels, namely, high bias power and low bias power is repeated by frequencies in the range of 0.1 to 10 kHz. Further, duration of the high bias power and that of the low bias power are controlled by a repetition frequency and a duty ratio. In addition, the duty ratio is a ratio of the duration of the high bias power to one period. Further, a power range of the low bias power can be set to be 'more than or equal to' 0 W and less than the high bias power.

Further, the dry etching apparatus includes a bias path control mechanism 420 that controls a rate of a bias current that transmits plasma, to the VHF radiating antenna 411, and the bias path control mechanism 420 can control a distribution of the plasma with a higher degree of accuracy. Depending on high power and low power of the time modulated bias power, the plasma is further stabilized in accordance with a change in plasma impedance. Therefore, period information about the time modulation from the radio frequency bias power supply 419 is input to the matching box for source electromagnetic field 402 and the bias path control mechanism 420.

The embodiment to which the present invention is applied will be described below with reference to the above-described dry etching apparatus.

First, FIG. 1 illustrates a cross sectional structure of a memory device part of a three-dimensional structure to which the present invention is applied. On a wafer substrate 101, a stopper film 102, a laminated film 107 in which a pair layer made of an $SiO_2$ film 103 being a silicon dioxide film and a Poly-Si film 104 being a polysilicon film is laminated in plurality, an inorganic film 105, and a mask 106 are arranged from below. A thickness of the pair layer being each layer of the laminated layer 107 is from 15 to 40 nm. Further, the inorganic film 105 is a film for forming a hard mask, and is an SiN film, an SiON film, an $SiO_2$ film, or the like. Further, a thickness of the inorganic film 105 is from 100 to 300 nm.

Further, in the present embodiment, an ACL mask is used as the mask 106. The ACL mask is a mask previously formed by a dry phenomenon. The dry phenomenon herein said is a mask forming method in which the hard mask made of an SiON film being an intermediate layer is formed through plasma etching by using the previously-patterned resist mask, and a pattern is continuously formed on the ACL film through the plasma etching by using the hard mask and the resist mask left at the time of forming the hard mask.

Figure 3A:
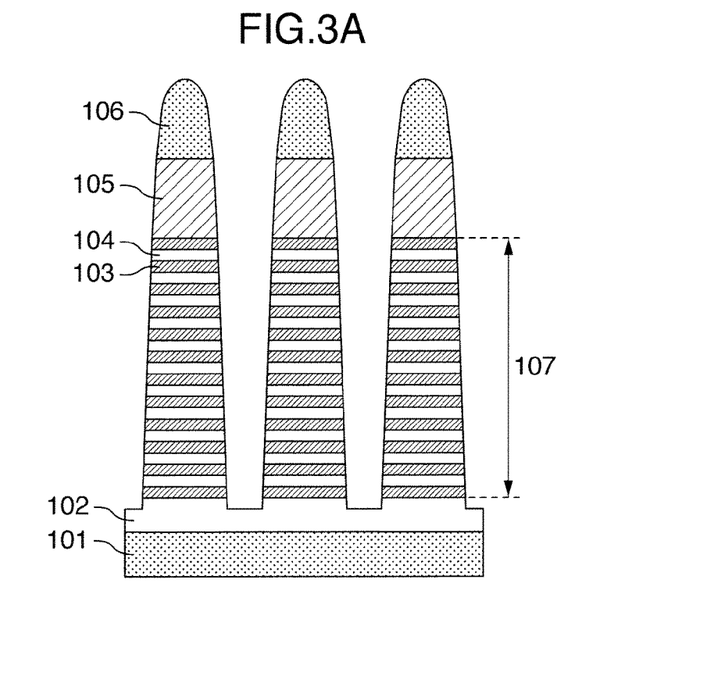
FIGS. 3A and 3B illustrate etching shapes in the case where the present invention is applied.

The inorganic film 105 and the laminated film 107 having the cross sectional structure as illustrated in FIG. 1 are consistently etched by using a mixed gas of an $NF_3$ gas and a $CH_3F$ gas. As a result, as illustrated in FIG. 3A, a residual amount of the mask 106 is sufficient and a shape in which side etching to the inorganic film 105 and a scalloping shape are suppressed can be obtained. A reason in which a shape as illustrated in FIG. 3A can be obtained is considered as described below.

First, the cause in which the residual amount of the ACL mask is short or in which the side etching and the scalloping shape occur is that a plasmatized fluorine element of a gas composition is excess to $CH_x$. That is, for the excess fluorine elements, an etching rate of the ACL mask increases, and the $SiO_2$ film 103, the Poly-Si film 104, and the inorganic film 105 are side-etched and a line dimension is retreated to a lower layer from an upper layer side surface in which a time at which each of the films is exposed to plasma is long. Accordingly, for suppressing the side etching and the scalloping shape from occurring, in the case where an $NF_3$ gas being a fluorine-containing gas as an etching gas is used as a main gas, a $CH_x$-based gas having a depositing property is required to be mixed in order to reduce a rate of the number of fluorine elements to the total number of elements constituting the mixed gas containing the fluorine-containing gas.

For example, in the mixed gas of an $NF_3$ gas and a $CHF_3$ gas, a ratio of the fluorine elements to the constituent elements of the mixed gas is large. Therefore, even if a rate of the $NF_3$ gas to the mixed gas of the $NF_3$ gas and the $CHF_3$ gas is reduced up to 5%, the side etching occurs in the inorganic film 105. In the case of increasing a rate of the $NF_3$ gas to the mixed gas, the side etching further increases and the scalloping shape occurs.

Further, in the mixed gas of the $NF_3$ gas and a $CH_2F_2$ gas, in the case where the rate of the $NF_3$ gas to the mixed gas is 50% or more, the side etching occurs in the inorganic film 105. In the case where the rate of the $NF_3$ gas to the mixed gas is 25% or less, a pore stack occurs through deposition of the upper part. Further, in the rate of the range from 25% to 50%, the side etching and the scalloping shape are prevented from occurring However, selectivity to a mask is low at about 1.1 and the side dropping 108 of the ACL mask occurs.

Further, in the case of using the mixed gas of the $NF_3$ gas and the $CH_3F$ gas, the residual amount of the ACL mask is sufficient, and the side etching and the scalloping shape can be suppressed from occurring. Further, depending on a pattern dimension about a numerical aperture of the pattern or a sparse and dense pattern in one chip, a flow volume of the $NF_3$ gas and that of the $CH_3F$ gas are adjusted to thereby suppress the side etching from occurring. In addition, the numerical aperture of the pattern means a rate of an area to be etched occupied in an area of the whole wafer substrate 101.

Specifically, a rate of the flow volume of the $NF_3$ gas to the mixed gas of the $NF_3$ gas and the $CH_3F$ gas is set to be 40 to 70%. Thereby, a shape in which the side etching and the scalloping shape are suppressed from occurring can be obtained. In the present embodiment, a case where the rate of the flow volume of the $NF_3$ gas to the mixed gas of the $NF_3$ gas and the $CH_3F$ gas is set to 11/20 is optimized.

Figure 5:
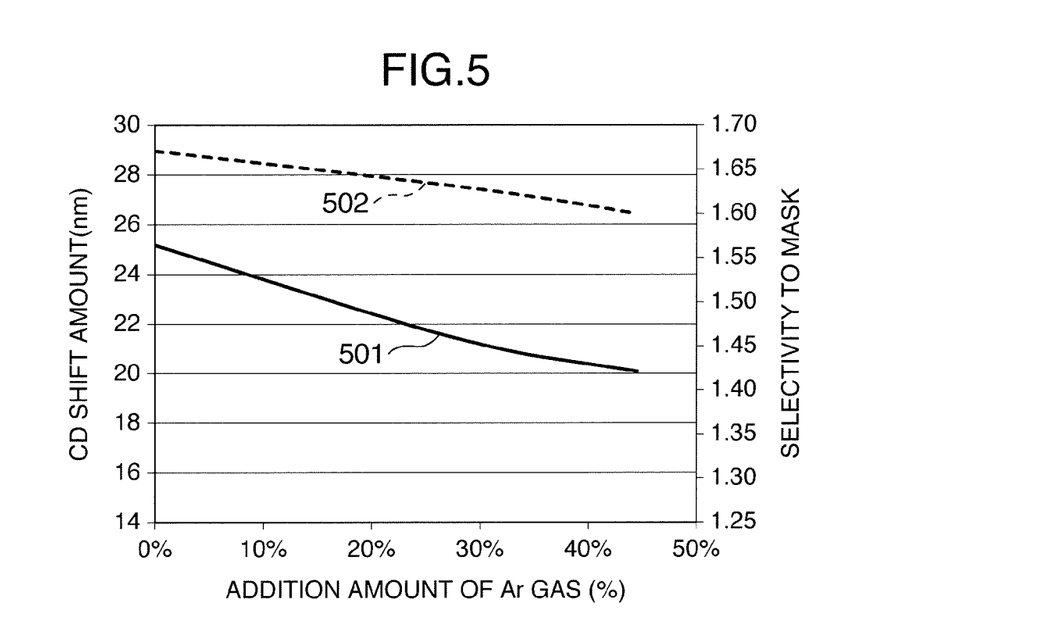
FIG. 5 illustrates dependency of a CD shift amount 501 to an addition amount of an Ar gas and the dependency of selectivity to a mask 502 to the addition amount of the Ar gas.

A noble gas and an $N_2$ gas are further mixed with the mixed gas of the $NF_3$ gas and the $CH_3F$ gas, and thereby both of an increase in the residual amount of the ACL mask and a suppression of the CD (Critical Dimension; hereinafter, referred to as CD) shift amount can be satisfied. First, FIG. 5 illustrates dependency of the CD shift amount 501 to an addition amount of an Ar gas and the dependency of the selectivity to a mask 502 to the addition amount of the Ar gas. Here, the selectivity to the mask is set as a ratio of the etching rate of the pair layer to the etching rate of the ACL mask.

It is understood, as illustrated in FIG. 5, that the CD shift amount 501 and the selectivity to the mask 502 are reduced along with an increase in the addition amount of the Ar gas. An improvement reason of the CD shift amount 501 is considered that a fluorocarbon-based gas is diluted due to the addition of the Ar gas, and a deposition amount of radicals can be suppressed. In the present embodiment, the Ar gas is used as the noble gas; further, in the present invention, a He gas, a Ne gas, or a Kr gas other than the Ar gas may be used.

Figure 6:
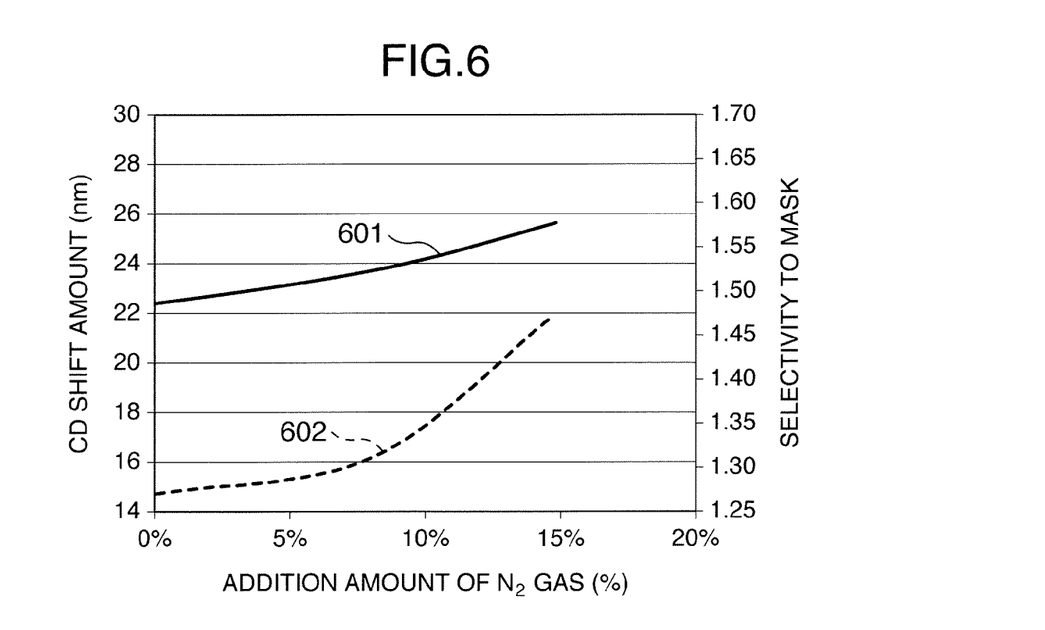
FIG. 6 illustrates the dependency of a CD shift amount 601 to an addition amount of an $N_2$ gas and the dependency of selectivity to a mask 602 to the addition amount of the $N_2$ gas.

Further, the addition of the $N_2$ gas is effective for improving the selectivity to the mask reduced due to the addition of the Ar gas. FIG. 6 illustrates the dependency of the CD shift amount 601 to the addition amount of the $N_2$ gas and the dependency of the selectivity to a mask 602 to the addition amount of the $N_2$ gas. It is understood, as illustrated in FIG. 6, that the CD shift amount 601 and the selectivity to the mask 602 increase along with an increase in the addition amount of the $N_2$ gas. As a result, FIG. 6 illustrates characteristics opposite to those of the addition of the Ar gas illustrated in FIG. 5; however, a reduction effect of the CD shift amount due to the addition of the Ar gas is more than that of the CD shift amount due to the addition of the $N_2$ gas.

That is, the CD shift amount is improved by the addition of the Ar gas and deterioration in the selectivity to the mask due to the addition of the Ar gas is improved by the addition of the $N_2$ gas. As a result, the selectivity to the mask is totally kept and a shape having a high anisotropy can be obtained. In the present embodiment, in the mixed gas of the $NF_3$ gas, the $CH_3F$ gas, the Ar gas, and the $N_2$ gas, a ratio of a gas flow amount of $NF_3:CH_3F:Ar:N_2=11:9:10:4$ is optimized.

Further, even if the mixed gas (a dilution rate of a $CH_4$ gas to the Ar gas is 4%) of the $CH_4$ gas and the Ar gas is used in place of the noble gas (for example, the Ar gas), the selectivity to the mask can be suppressed from being reduced while the CD shift amount is improved. Even if NH is added in place of the mixed gas (the dilution rate of the $CH_4$ gas to the Ar gas is 4%) of the $CH_4$ gas and the Ar gas, the same effect can be obtained.

Figure 7:
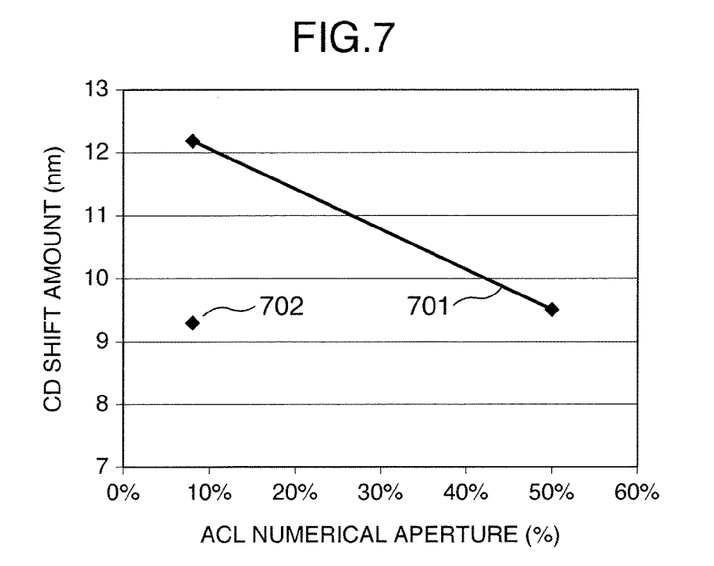
FIG. 7 illustrates the dependency of a CD shift amount 701 to a numerical aperture of a pattern in an ACL mask in the case where an addition amount of an $O_2$ gas is 20 sccm, and a CD shift amount 702 in the case where the addition amount of the $O_2$ gas in which the numerical aperture of the pattern in the ACL mask is 8% is 30 sccm.

In the present invention, an $O_2$ gas is further added to the mixed gas of the $NF_3$ gas, the $CH_3F$ gas, the Ar gas, and the $N_2$ gas. Thereby, the CD shift amount can be adjusted and a response to a change in the numerical aperture of the pattern can be carried out. FIG. 7 illustrates the dependency of the CD shift amount 701 to the numerical aperture of the pattern in the ACL mask in the case where the addition amount of the $O_2$ gas is 20 sccm, and the CD shift amount 702 in the case where the addition amount of the $O_2$ gas in which the numerical aperture of the pattern in the ACL mask is 8% is 30 sccm.

It is understood that the CD shift amount 701 increases along with a decrease in the numerical aperture of the pattern. This result is considered that along with a decrease in the numerical aperture of a trench pattern, carbon-based reaction products from the ACL mask increase in plasma and the amount of re-entering the trench pattern also increases. Accordingly, in the case where the numerical aperture of the pattern decreases, the addition amount of the $O_2$ gas is increased. Thereby, a carbon-based deposition film increased by the re-entering is removed and the CD shift amount is improved to thereby obtain a shape having a high anisotropy.

However, the selectivity to the ACL mask decreases along with an increase in the addition amount of the $O_2$ gas, and therefore the excess addition amount of the $O_2$ gas is required to be avoided depending on the numerical aperture of the pattern. In the case where the numerical aperture of the pattern is 8%, when the addition amount of the $O_2$ gas is set to be 9% or less, a selectivity of 1.7 or more being the selectivity required for processing of the pair layer is obtained. Therefore, in the case where the numerical aperture of the pattern is 8%, the addition amount of the $O_2$ gas is desired to be 9% or less.

Further, when a gas containing a carbon element and an oxygen element of a CO gas or a $CO_2$ gas is used as an alternative gas of the $O_2$ gas, a removing power of the carbon-based deposition film is weakened, and therefore the addition amount of the gas containing a carbon element and an oxygen element is more required as compared to the addition amount of the oxygen gas. Through the above fact, when the addition amount of the $O_2$ gas is small, the adjustment is advantageously easy to carry out in the wide range of the gas flow amount.

Figure 8:
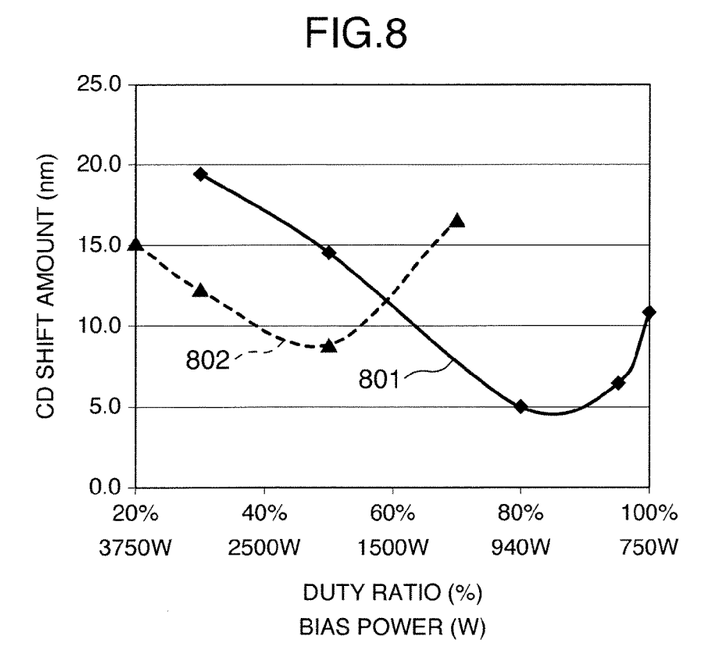
FIG. 8 illustrates the dependency of the CD shift amount to a duty ratio of modulated radio frequency bias power of two levels.

Further, the mixed gas of the $NF_3$ gas, the $CH_3F$ gas, the Ar gas, and the $N_2$ gas is used and at the same time the time modulated radio frequency bias of two levels is applied, and thereby the CD shift amount can be reduced. FIG. 8 illustrates the dependency of the CD shift amount to the duty ratio of the time modulated radio frequency bias power of two levels. In addition, high bias power in each duty ratio is set so that time averages of the time modulated radio frequency bias power in each duty ratio are equal to each other. Here, the time average of the time modulated radio frequency bias power is set to a value obtained by the product of the high bias power and the duty ratio. Further, the repetition frequency of the time modulation is set to 1 kHz, and the low power is set to 0 W.

As illustrated in FIG. 8, in a result 801 in the case where the numerical aperture of the pattern is 8%, when the duty ratio is 80%, the CD shift amount is a minimum value. Further, in a result 802 in the case where the numerical aperture of the pattern is 50%, when the duty ratio is 50%, the CD shift amount is the minimum value. In this result, in the gas plasma having a strong depositing property used to satisfy both of an effect of reducing the side etching and an effect of improving the selectivity of the ACL mask as in the present invention, when the numerical aperture of the pattern is low, since a deposition duration of deposition is reduced in a high duty ratio in which a low power time is shortened, a pore stack due to the deposition in a pore can be avoided. On the other hand, when the numerical aperture of the pattern is high, a re-entering amount of a carbon-based deposition is reduced. Therefore, since the deposition duration of the deposition is increased in a low duty ratio in which the low power time is lengthened, the CD shift amount can be improved. That is, this result indicates that a response to the numerical aperture of the pattern can be carried out.

On the basis of the above-described fact, the present invention may be preferably applied to a case where the numerical aperture of the pattern is from 5 to 70%. About the duty ratio, when the numerical aperture of the pattern is low at 30% or less, the duty ratio may be preferably used from 50% or more in which re-deposition is confirmed to 95% or less in which an effect of providing the deposition duration is confirmed. Further, when the pore stack occurs due to the deposition of the upper part in the pattern, minimum power in which the deposition can be removed is set during the duration in which the power is low. As a result, the pore stack of the pattern can be avoided and an effect of the time modulated radio frequency bias can be kept.

As described above, in the present invention, the mixed gas of the $NF_3$ gas, the $CH_3F$ gas, the Ar gas, the $N_2$ gas, and the $O_2$ gas is used, and process pressure is set to 0.6 to 4 Pa in accordance with the numerical aperture of the pattern, a thickness of the ACL mask, and an aperture dimension.

Figure 3B:
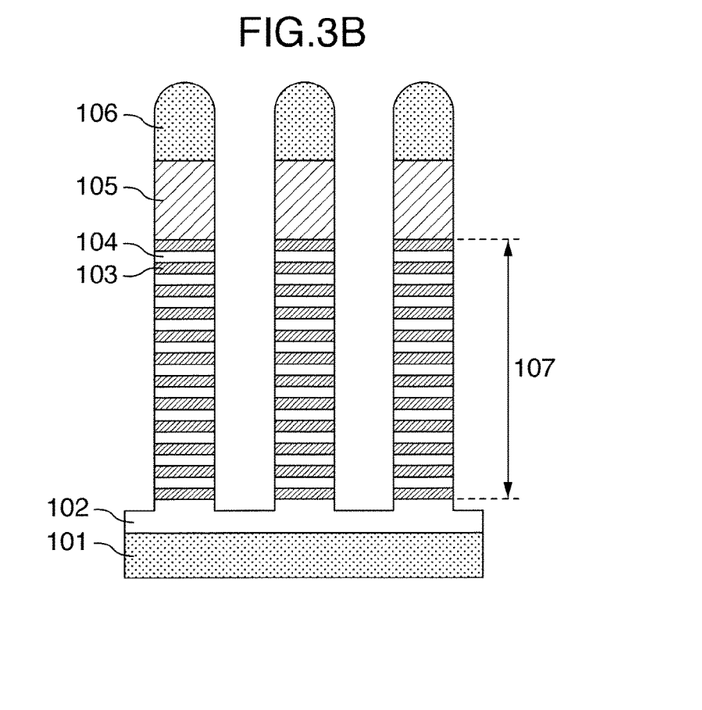

Further, the duty ratio, the high power, and the low power of the time modulated radio frequency bias of two levels are adjusted. Thereby, an approximately vertical shape can be obtained as illustrated in FIG. 3B. Further, the method of the present invention is different from the etching method disclosed in JP-A-2013-80909, and the pressure is not required to be changed on the way. Therefore, a reduction in the throughput can be suppressed.

As described above, the process pressure may be preferably used from 0.6 Pa or more in which as the pressure is higher, higher mask selectivity is obtained with a higher etching rate to 4 Pa or less in which an effect of the ion shading is suppressed in the dimension of the numerical aperture of the pattern of 50 nm or less.

Further, about the $CH_3F$ gas and the $O_2$ gas in the mixed gas of the $NF_3$ gas, the $CH_3F$ gas, the Ar gas, the $N_2$ gas, and the $O_2$ gas of the present invention, an explosive gas and an assistance gas are combined. A problem is not basically present in the use under the process pressure of 10 Pa or less. Further, a heat source more than 200° C. is not provided on the part that is brought into contact with the gas, and thereby safety is further improved. For example, in the parallel plate type effective magnetic field VHF dry etching apparatus, a pressure gauge using a crystal oscillator with filament heating at about 200° C. is unnecessary or a pressure gauge using a diaphragm cold cathode is used. Further, a temperature of the etching chamber 406 may also be preferably controlled to be 100° C. or less.

Further, the pair layer of the present embodiment is a pair layer made of a silicon dioxide film and a polysilicon film. In the present invention, a pair layer made of a silicon dioxide film and a silicon nitride film (SiN film) may be used, or a pair layer made of a silicon dioxide film and a tungsten silicide film (WSi film.) may be used.

Further, in the present embodiment, the parallel plate type effective magnetic field VHF dry etching apparatus is used. Further, even if the present invention is applied to a plasma etching apparatus in which other plasma sources such as capacitive coupling type plasma, inductive coupling type plasma, and microwave electron cyclotron resonance (ECR) plasma are used, the same effect as that of the present invention can be obtained.

The invention claimed is:

1. A method of dry etching a sample including an inorganic film arranged over a laminated film, the laminated film including a silicon-containing film and a silicon dioxide film alternately laminated, the method comprising:
providing a mixed gas including an $NF_3$ gas, a $CH_3F$ gas, an $O_2$ gas, an $N_2$ gas and a He gas, wherein the mixed gas is provided at a set flow volume rate, and wherein the set flow volume rate, which is a rate of a flow volume of the $NF_3$ gas to a flow volume of the mixed gas, is a value in a range of from 40% to 70%; and
etching consistently the inorganic film and the laminated film using plasma, the plasma being obtained from the mixed gas.

2. The dry etching method according to claim 1, wherein the silicon-containing film is a polysilicon film.

3. The dry etching method according to claim 1, further comprising:
supplying a time modulated radio frequency power to the sample,
wherein a duty ratio of the time modulation is determined based on a numerical aperture of a pattern, the numerical aperture of the pattern being a ratio of an area to be etched to an area of the sample.

4. The dry etching method according to claim 3, wherein the duty ratio of the time modulation is a value in the range of 50% to 95%.

5. A method of dry etching a sample including an inorganic film arranged over a laminated film, the laminated film including a silicon-containing film and a silicon dioxide film alternately laminated, the method comprising:
providing a mixed gas including an $NF_3$ gas and a $CH_3F$ gas, wherein the mixed gas is provided at a set flow volume rate, and wherein the set flow volume rate, which is a rate of a flow volume of the $NF_3$ gas to a flow volume of the mixed gas, is a value in a range of from 40% to 70%; and
etching consistently the inorganic film and the laminated film using plasma, the plasma being obtained from the mixed gas.

6. The dry etching method according to claim 5, further comprising:
supplying a time modulated radio frequency power to the sample,
wherein a duty ratio of the time modulation is determined based on a numerical aperture of a pattern, the numerical aperture of the pattern being a ratio of an area to be etched to an area of the sample.

7. The dry etching method according to claim 6, wherein the duty ratio of the time modulation is a value in the range of 50% to 95%.

8. A method of dry etching a sample including an inorganic film arranged over a laminated film, the laminated film including a silicon-containing film and a silicon dioxide film alternately laminated, the method comprising:
providing a mixed gas including an $NF_3$ gas, a $CH_3F$ gas, an $O_2$ gas, an $N_2$ gas and a He gas, wherein the mixed gas is provided at a set flow volume rate, and wherein the set flow volume rate, which is a rate of a flow volume of the $NF_3$ gas to a flow volume of the mixed gas, is a value in a range of from 40% to 70%; and
etching the inorganic film and the laminated film using plasma only obtained from the mixed gas.

9. The dry etching method according to claim 8, further comprising:
supplying a time modulated radio frequency power to the sample,
wherein a duty ratio of the time modulation is determined based on a numerical aperture of a pattern, the numerical aperture of the pattern being a ratio of an area to be etched to an area of the sample.

10. The dry etching method according to claim 9, wherein the duty ratio of the time modulation is a value in the range of 50% to 95%.

* * * * *